US009735196B2

(12) United States Patent
Yang et al.

(10) Patent No.: US 9,735,196 B2
(45) Date of Patent: Aug. 15, 2017

(54) PHOTOSENSITIVE CAPACITOR PIXEL FOR IMAGE SENSOR

(71) Applicant: OMNIVISION TECHNOLOGIES, INC., Santa Clara, CA (US)

(72) Inventors: Wu-Zang Yang, Shi-Hu Town (TW); Chia-Ying Liu, Hsinchu (TW); Chih-Wei Hsiung, San Jose, CA (US); Chun-Yung Ai, Taipei (TW); Dyson H. Tai, San Jose, CA (US); Dominic Massetti, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/286,392

(22) Filed: Oct. 5, 2016

(65) Prior Publication Data

US 2017/0025468 A1    Jan. 26, 2017

Related U.S. Application Data

(62) Division of application No. 14/662,655, filed on Mar. 19, 2015, now Pat. No. 9,490,282.

(51) Int. Cl.
  *H01L 27/146*  (2006.01)
  *H01L 49/02*  (2006.01)

(52) U.S. Cl.
  CPC .... *H01L 27/14692* (2013.01); *H01L 27/1461* (2013.01); *H01L 27/1464* (2013.01);
  (Continued)

(58) Field of Classification Search
  CPC ............. H01L 27/1462; H01L 27/1464; H01L 27/14636; H01L 27/14685;
  (Continued)

(56) References Cited

U.S. PATENT DOCUMENTS 3,745,504 A    7/1973   Mooney
3,883,882 A    5/1975   Mori
(Continued)

FOREIGN PATENT DOCUMENTS

CN    104103654 A    10/2014
JP    S 61-203669 A    9/1986
(Continued)

OTHER PUBLICATIONS

Manabe, S. et al., "A 2-Million-Pixel CCD Image Sensor Overlaid with an Amorphous Silicon Photoconversion Layer," IEEE Transaction on Electron Devices, vol. 38, No. 8, Aug. 1991, pp. 1765-1771.
(Continued)

*Primary Examiner* — Nathan W Ha
(74) *Attorney, Agent, or Firm* — Christensen O'Connor Johnson Kindness PLLC

(57) ABSTRACT

A method of fabricating a pixel array includes forming a transistor network along a frontside of a semiconductor substrate. A contact element is formed for every pixel in the pixel array that is electrically coupled to a transistor within the transistor network. An interconnect layer is formed upon the frontside to control the transistor network with a dielectric that covers the contact element. A cavity is formed in the interconnect layer. A conductive layer is formed along cavity walls of the cavity and a dielectric layer is formed over the conductive layer within the cavity. A photosensitive semiconductor material is deposited over the dielectric layer within the cavity. An electrode cavity is formed that extends into the contact element. The electrode cavity is at least partially filled with a conductive material to form an electrode. The electrode, the conductive layer, and the photosensitive semiconductor material form a photosensitive capacitor.

10 Claims, 14 Drawing Sheets

(52) U.S. Cl.
CPC .. *H01L 27/14607* (2013.01); *H01L 27/14612* (2013.01); *H01L 27/14629* (2013.01); *H01L 27/14636* (2013.01); *H01L 27/14685* (2013.01); *H01L 27/14687* (2013.01); *H01L 27/14689* (2013.01); *H01L 27/14609* (2013.01); *H01L 27/14638* (2013.01); *H01L 28/55* (2013.01); *H01L 28/56* (2013.01); *H01L 28/90* (2013.01)

(58) Field of Classification Search
CPC ......... H01L 27/14612; H01L 27/14687; H01L 28/55; H01L 28/56; H01L 28/90
See application file for complete search history.

(56) References Cited

U.S. PATENT DOCUMENTS

| | | | |
|---|---|---|---|
| 6,204,524 | B1 | 3/2001 | Rhodes |
| 7,944,020 | B1 | 5/2011 | Korobov et al. |
| 2004/0016946 | A1 | 1/2004 | Oashi |
| 2007/0181816 | A1 | 8/2007 | Ikeda et al. |
| 2008/0171137 | A1 | 7/2008 | Kim et al. |
| 2008/0258248 | A1 | 10/2008 | Kim |
| 2008/0280400 | A1 | 11/2008 | Aihara |
| 2009/0166074 | A1* | 7/2009 | Furuya ............... H01G 4/224 174/260 |
| 2009/0166787 | A1 | 7/2009 | Park |
| 2011/0133061 | A1 | 6/2011 | Yu et al. |
| 2011/0284991 | A1* | 11/2011 | Hijioka ............. H01L 23/5223 257/532 |
| 2011/0315988 | A1 | 12/2011 | Yu et al. |
| 2012/0218485 | A1* | 8/2012 | Chikama .......... G02F 1/136213 349/39 |
| 2012/0248443 | A1* | 10/2012 | Katsui ................. G02F 1/1368 257/57 |
| 2014/0138521 | A1 | 5/2014 | Liu et al. |
| 2014/0299956 | A1 | 10/2014 | Hsiung et al. |
| 2015/0041953 | A1 | 2/2015 | Chen et al. |
| 2015/0187826 | A1 | 7/2015 | Suzuki |
| 2016/0276380 | A1 | 9/2016 | Yang et al. |

FOREIGN PATENT DOCUMENTS

| | | |
|---|---|---|
| JP | S 63-20869 A | 1/1988 |
| JP | H 08-064856 A | 3/1996 |
| JP | 2004-063559 A | 2/2004 |
| JP | 2008-147421 A | 6/2008 |
| JP | 2008-270710 A | 11/2008 |
| JP | 2009-158930 A | 7/2009 |
| JP | 2014-239266 A | 12/2014 |
| WO | WO 2014-021115 A1 | 7/2016 |

OTHER PUBLICATIONS

Yamashita, H. et al., "TP 13.4: A ⅔-inch 2M-Pixel STACK-CCD Imager," ISSCC94, Session 13, Neural Networks and Image Sensors—Paper TP 13.4, 1994, IEEE International Solid-State Circuits Conference, Feb. 17, 1994, Digest of Technical Papers, pp. 224-225.
EP Patent Application No. 16159470.0—Extended European Search Report, dated Jul. 6, 2016, 5 pages.
TW Patent Application No. 105105547—Taiwanese Office Action and Search Report, dated Jan. 17, 2017, with English Translation, 10 pages.
JP Patent Application No. 2016-055392—Japanese Office Action and Search Report, dated Jan. 23, 2017, with English Translation, 15 pages.

* cited by examiner

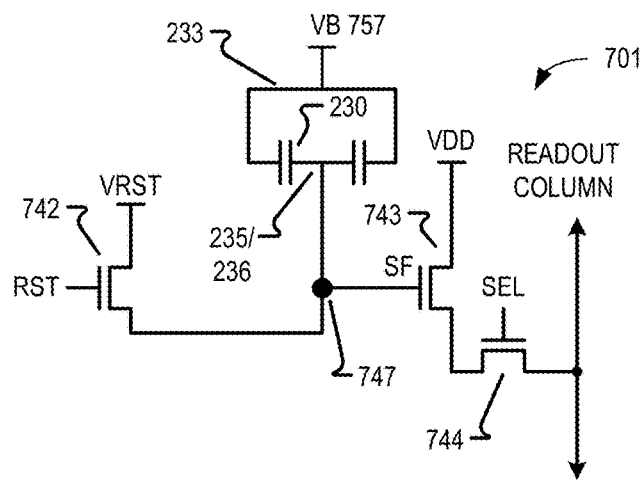
FIG. 7A
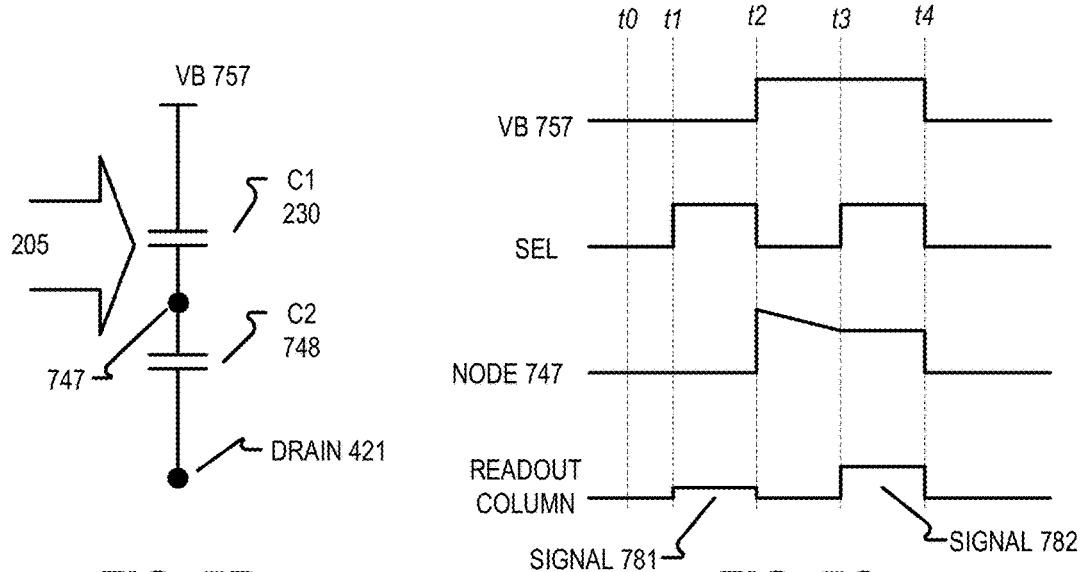
FIG. 7B          FIG. 7C

PHOTOSENSITIVE CAPACITOR PIXEL FOR IMAGE SENSOR

CROSS-REFERENCE TO RELATED APPLICATIONS

This application is a divisional of U.S. patent application Ser. No. 14/662,655, filed on Mar. 19, 2015, now pending. U.S. patent application Ser. No. 14/662,655 is hereby incorporated by reference.

TECHNICAL FIELD

This disclosure relates generally to image sensing and in particular to a photosensitive capacitor as a pixel or pixels within an image sensor.

BACKGROUND INFORMATION

An image sensor is an electronic device that converts light (in the form of an optical image) into electronic signals. Modern image sensors are generally semiconductor charge-coupled devices ("CCD") or active pixel sensors fabricated using complementary metal-oxide-semiconductor ("CMOS") technologies.

CMOS image sensors have become ubiquitous in many modern electronic devices. Cell phones, laptops, and cameras can all utilize CMOS image sensors as a primary method of image/light detection. Device manufacturers are striving to reduce cost and increase performance of image sensors to meet retail and commercial demand. Existing CMOS image sensor fabrication differs from standard CMOS fabrication processes, which adds additional steps, time, and cost to fabricating image sensors.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIGS. 7A-B illustrate schematic modelings of a pixel that includes a photosensitive capacitor coupled to a gate of a transistor of the pixel, in accordance with an embodiment of the disclosure.

FIG. 7C illustrates an example timing diagram for operation of the pixel illustrated in FIG. 7A, in accordance with an embodiment of the disclosure.

DETAILED DESCRIPTION

Embodiments of an image sensor pixel and an image sensor that includes a photosensitive capacitor are described herein. Methods of fabricating and operating a pixel that includes a photosensitive capacitor are also described in this disclosure. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
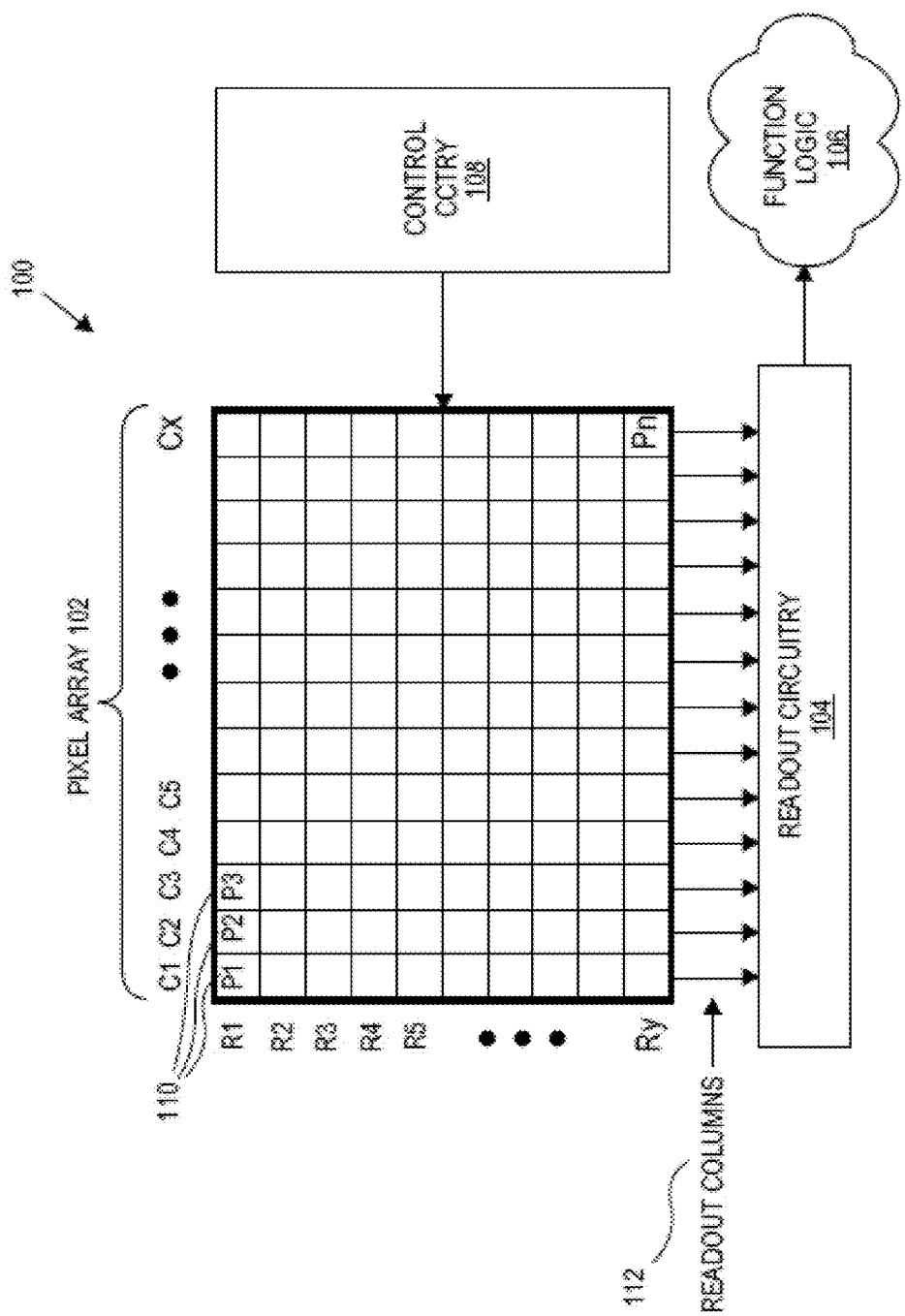
FIG. 1 is a block diagram schematic illustrating one example of an imaging system that includes a pixel array including photosensitive capacitor pixels, in accordance with an embodiment of the disclosure.

FIG. 1 is a block diagram schematic illustrating one example of an imaging system 100 that includes a pixel array 102 of photosensitive capacitor pixels, in accordance with an embodiment of the disclosure. Imaging system 100 includes a pixel array 102, control circuitry 108, readout circuitry 104, and function logic 106. As shown in the depicted example, imaging system 100 includes pixel array 102 which is coupled to control circuitry 108 and readout circuitry 104. Readout circuitry 104 is coupled to function logic 106. Control circuitry 108 is coupled to pixel array 102 to control operational characteristics of pixel array 102 in order to capture images generated by image light received by pixel array 102. For example, control circuitry 108 may generate a shutter signal or a plurality of shutter signals for controlling image acquisition.

In one example, pixel array 102 is a two-dimensional (2D) array of imaging sensors or pixels 110 (e.g., pixels P1, P2 . . . , Pn). In one example, each pixel 110 includes a photosensitive capacitor that is coupled to transistors to facilitate readout. As illustrated, each pixel 110 is arranged into a row (e.g., rows R1 to Ry) and a column (e.g., column C1 to Cx) to acquire image data of a person, place, object, etc., which can then be used to render an image of the person, place, object, etc.

In one example, after each pixel 110 has acquired its image data or image charge, the image data is read out by readout circuitry 104 through readout columns 112 and then transferred to function logic 106. In various examples, readout circuitry 104 may include amplification circuitry, analog-to-digital (ADC) conversion circuitry, or otherwise. Function logic 106 may simply store the image data or even manipulate the image data by applying post image effects (e.g., crop, rotate, remove red eye, adjust brightness, adjust contrast, or otherwise). In one example, readout circuitry 104 may read out a row of image data at a time along readout column lines (illustrated) or may read out the image data using a variety of other techniques (not illustrated), such as a serial read out or a full parallel read out of all pixels simultaneously.

Figure 2:
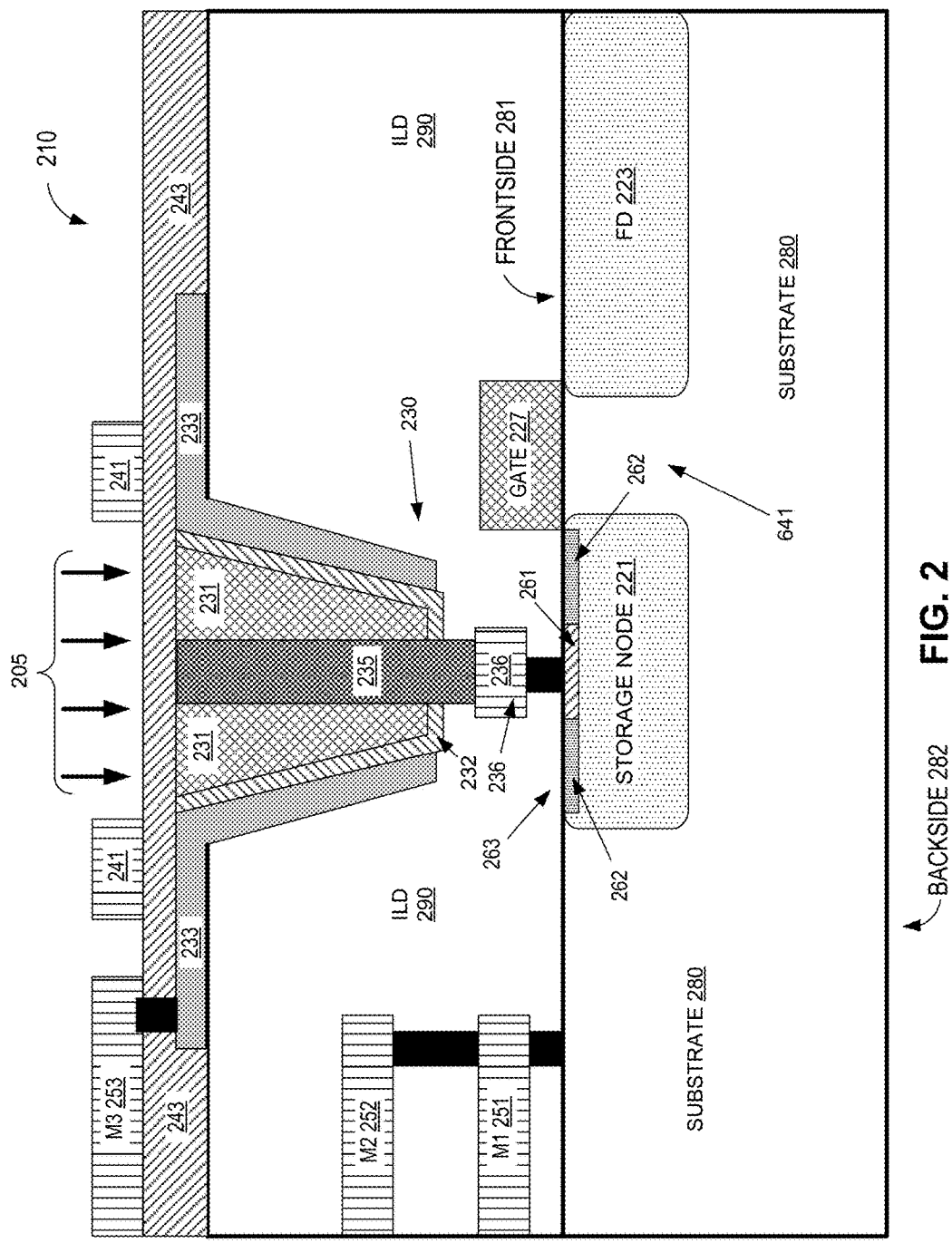
FIG. 2 illustrates one example of a photosensitive capacitor included in a pixel, in accordance with an embodiment of the disclosure.

FIG. 2 illustrates a cross section of an example of a photosensitive capacitor 230 included in a pixel 210, in accordance with an embodiment of the disclosure. Pixel 210 is one example of pixel 110. Pixel 210 includes a photosensitive capacitor 230 that includes electrode 235, conductive layer 233, dielectric layer 232, and photosensitive semiconductor material 231. Electrode 235 functions as one conductor or "plate" of the photosensitive capacitor 230 and conductive layer 233 functions as the second conductor or "plate" of photosensitive capacitor 230. Conductive layer 233 is shaped like a tube, in one embodiment. Dielectric layer 232 isolates conductive layer 233 from photosensitive semiconductor material 231, which is disposed between electrode 235 and dielectric layer 232. In one embodiment, photosensitive semiconductor material 231 includes low temperature polysilicon. In one embodiment, photosensitive semiconductor material 231 includes amorphous polysilicon. Amorphous polysilicon generally blocks wavelengths greater than 650 nm. Using amorphous polysilicon as photosensitive semiconductor material 231 potentially allows for the elimination of an infrared filter above pixel 410 to reject light above the non-visible spectrum. Conductive layer 233 may be a metal such as titanium-nitride ("TiN") or tantalum-nitride ("TaN").

In operation, photosensitive semiconductor material 231 receives image light 205 along an axis that electrode 235 is extended along. Image light 205 may propagate through passivation layer 243 before encountering photosensitive semiconductor material 231. Image light 205 may also pass through unknown additional optics (e.g. lenses) and filters (e.g. color filters) before encountering photosensitive semiconductor material 231. Photosensitive semiconductor material 231 generates an image signal in the form of photoelectrons in response to receiving image light 205. The photoelectrons flow to storage node 221 via electrode 235 (and via metal connect 236 in the illustrated embodiment). After an exposure duration (a.k.a. an "integration period"), image charge generated by the image signal in charge storage node 221 can be transferred to floating drain 223 and eventually readout by readout circuitry. Transfer transistor 641 includes gate 227, charge storage node 221, and floating diffusion 223. To transfer image charge from charge storage node 221 to floating diffusion 223, transfer transistor 641 is activated by applying a voltage to gate 227. Generally, a negative voltage will activate a P type transistor while a positive voltage (being over the threshold voltage) will activate an N type transistor.

In FIG. 2, transfer transistor 641 is disposed along a frontside 281 of semiconductor substrate 280. Frontside 281 is opposite a backside 282 of semiconductor substrate 280. Semiconductor substrate 280 may be P doped silicon and storage node 221 and floating diffusion 223 may be N– doped. FIG. 2 shows that pixel 210 is a frontside illuminated pixel and an image sensor that included in an array of pixels 210 would be considered a frontside illuminated image sensor by those skilled in the art because image light 205 would encounter the frontside 281 of substrate 280 prior to encountering the backside 282. In contrast, backside illuminated image sensors typically thin the backside of the semiconductor substrate so that storage node 221 (functioning as a photodiode) receives image light from the thinned backside of the semiconductor substrate. Backside illuminated image sensor having conventional photodiode pixels generally provide better optical efficiency than frontside illuminated image sensors with conventional photodiode pixels as image light does not have to travel through an interconnect layer (for controlling readout of the photodiodes) that absorbs a portion of the image light.

In FIG. 2, image light 205 does not have to travel to a photodiode through an interconnect layer. Rather image light 205 encounters photosensitive semiconductor material 231 of photosensitive capacitor 230 without traveling through an interconnect layer that includes metal layers 251, 252, and interlayer dielectric 290. Electrode 235 is extended along an axis and photosensitive semiconductor material 231 is disposed coaxially around electrode 235, in the illustrated embodiment. Electrode 235 is cylindrical, in one embodiment, although it may be shaped differently in other embodiments. In the illustrated embodiment, photosensitive semiconductor material 231 is shaped as an inverted truncated cone centered around the axis the electrode is extended along. In the illustrated embodiment, the wider end of the inverted truncated cone is positioned to receive image light 205. The wider end is opposite a narrower end of the inverted truncated cone that is closest to the charge storage node 221.

In one embodiment, electrode 235 is made of a highly doped (N+) low temperature polysilicon. In another embodiment, electrode 235 is metal. Dielectric layer 232 is a high K dielectric in one embodiment. In one embodiment, dielectric layer 232 is a negatively charged material that has a fixed negative charge. A negative charge layer may induce a depletion zone at an interface of dielectric layer 232 and photosensitive semiconductor material 231 which will prevent photogenerated electrons from leaching into the dielectric layer. Instead, the photogenerated electrons will be more likely to flow toward electrode 235 and ultimately into charge storage node 221. Of course, dielectric layer 232 also serves as a non-conductive buffering layer between conductive layer 233 and photosensitive semiconductor material 231. In one embodiment, hafnium-aluminum-oxide is used for a negative charge layer.

FIGS. 3A-3I show an example process for fabricating photosensitive capacitors pixels 210, in accordance with an embodiment of the disclosure. It is understood that the techniques disclosed to fabricate one pixel can be utilized to fabricate an array of photosensitive capacitor pixels on a semiconductor substrate.

Figure 3A:
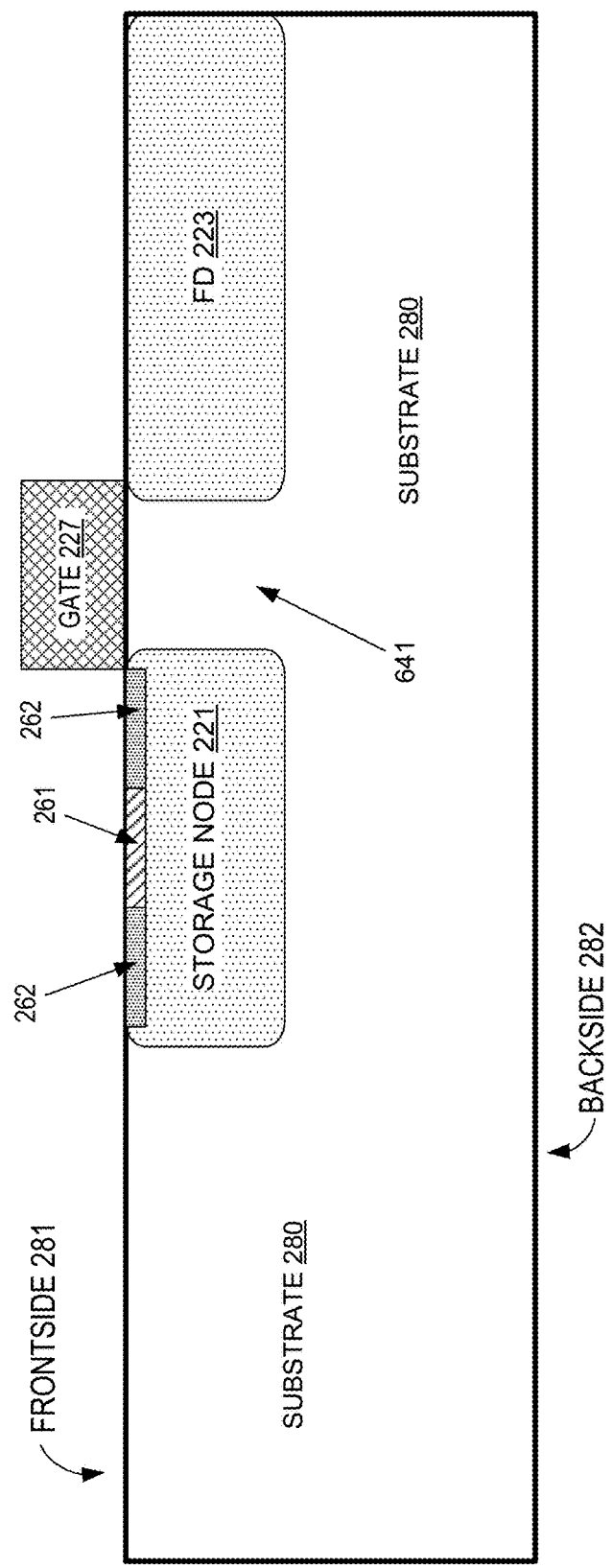
FIGS. 3A-3I show an example process for fabricating photosensitive capacitor pixels, in accordance with an embodiment of the disclosure.

FIG. 3A shows a semiconductor substrate 280, which may be P doped silicon. A transistor network to support each pixel is formed in substrate 280, although not all the transistors are shown in FIG. 3A. The transistor networks will be discussed below in connection with FIGS. 6 and 7A and may differ depending on the specific embodiment implemented. Transistor 641 includes storage node 221, gate 227, and floating diffusion 223. Storage node 221, gate 227, and floating diffusion 223 may be formed along the frontside 281 of substrate 280 using conventional methods to form CMOS transistors (e.g. diffusion or implantation). Other transistors (not shown in FIG. 3A) in the transistor network may also be formed along frontside 281 of substrate 280.

Figure 3B:
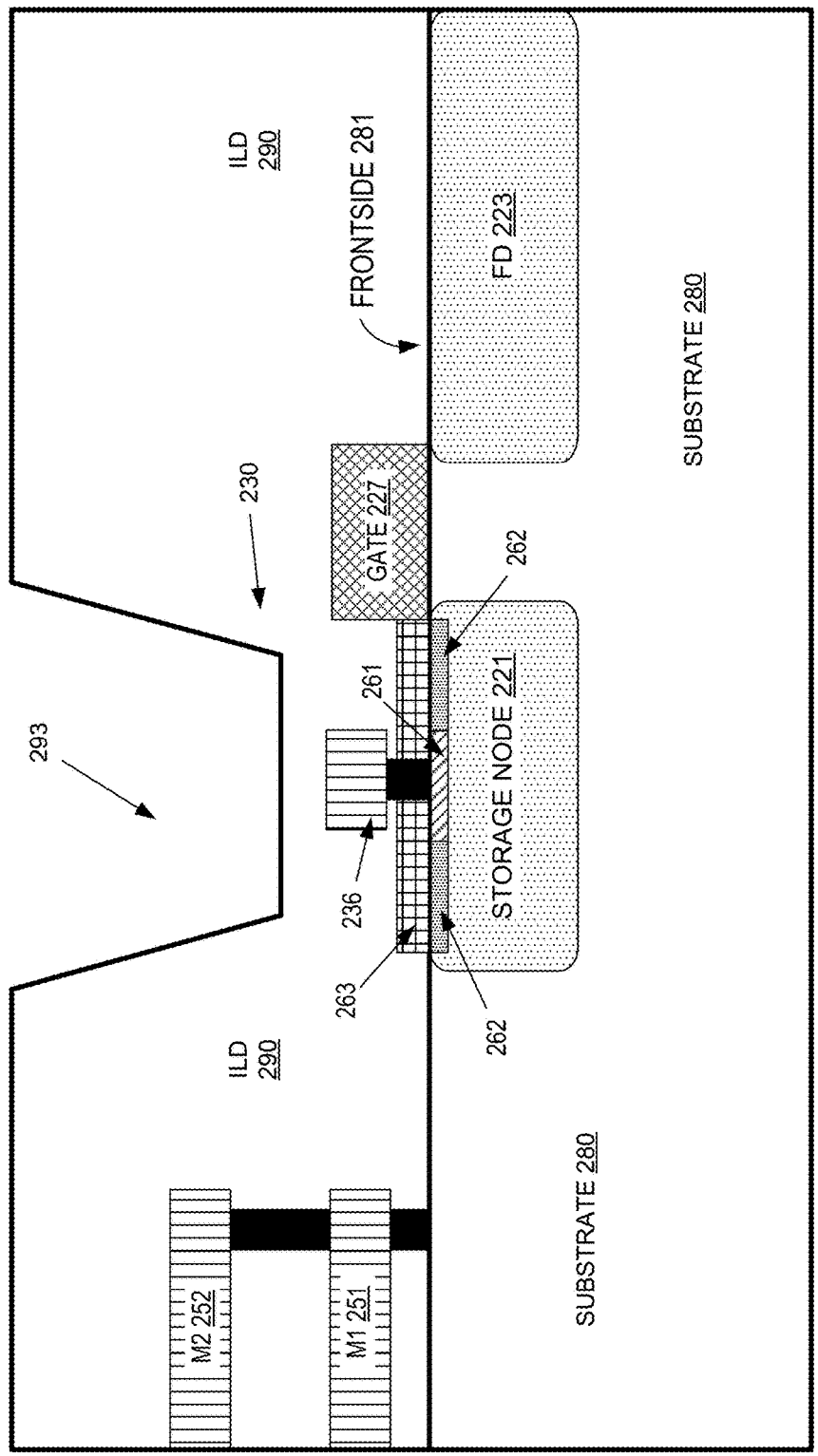

In the illustrated embodiment, storage node 221 includes P-pinning layer 262, which may reduce dark current at an interface between substrate 280 and the interlayer dielectric 290 formed in FIG. 3B. A contact layer 261 is formed in storage node 221. Contact layer 261 may be N+ doped compared with the N– doping of storage node 221.

FIG. 3B shows a next stage in the example fabrication process. In FIG. 3B, a high K dielectric layer 263 is formed over charge storage node 221 and an interconnect layer is formed on the frontside 281 of the semiconductor substrate 280. The interconnect layer facilitates controlling pixel transistor networks to readout the photosensitive capacitors. The interconnect layer includes metal layers 251 and 252 as well as interlayer dielectric 290. A contact element 236 is formed to connect to contact layer 261. Contact element 236 may be formed as part of the formation of first metal layer 251. Contact element 236 includes the blackened rectangle that extends down to contact layer 261, in FIG. 3B. After contact element 236 is formed, interlayer dielectric 290 is formed over contact element 236. After interlayer dielectric 290 is formed over the metal layers, a cavity 293 is formed in interlayer dielectric 290 over contact element 236.

Figure 3C:
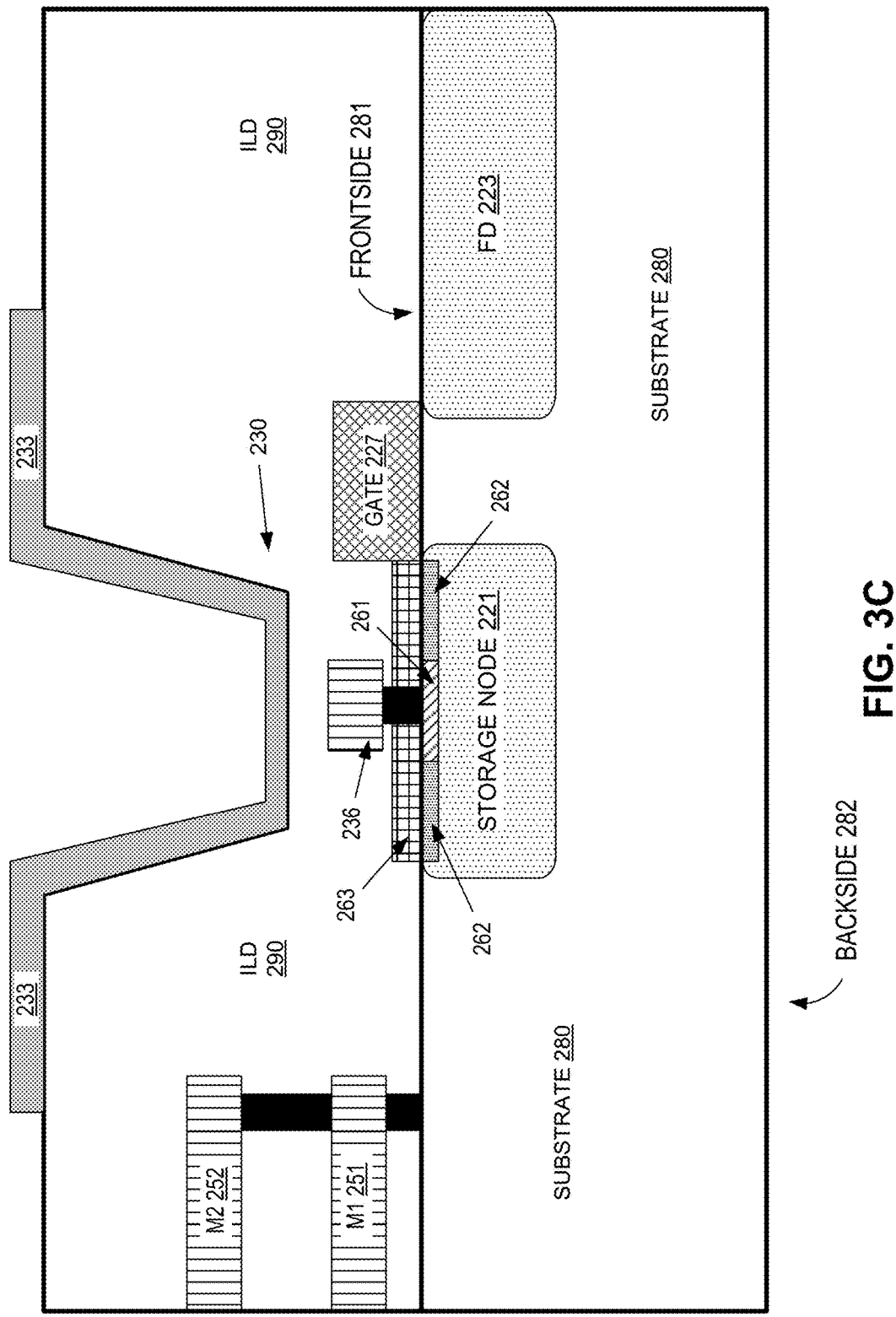
Figure 3D:
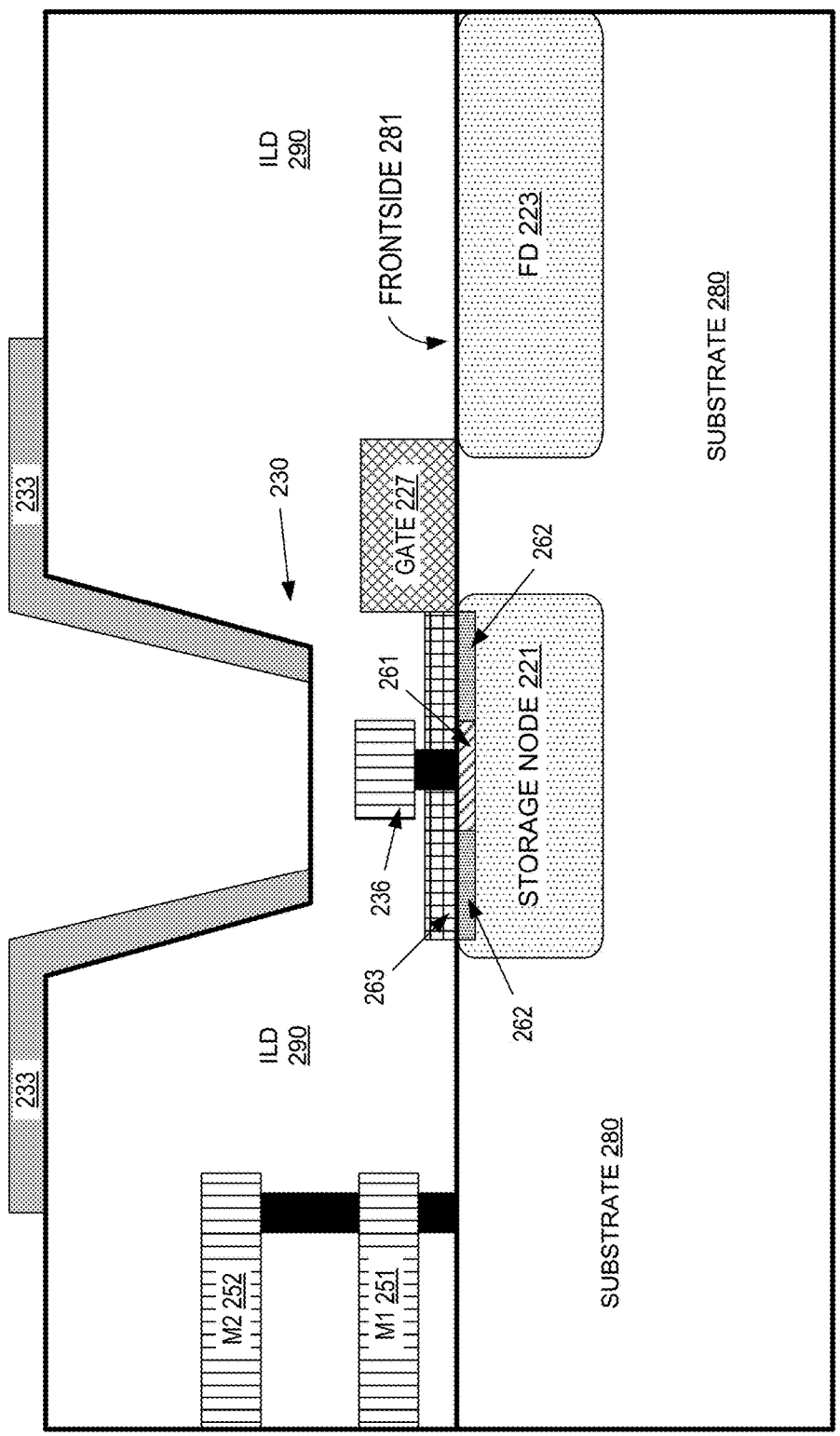
Figure 3E:
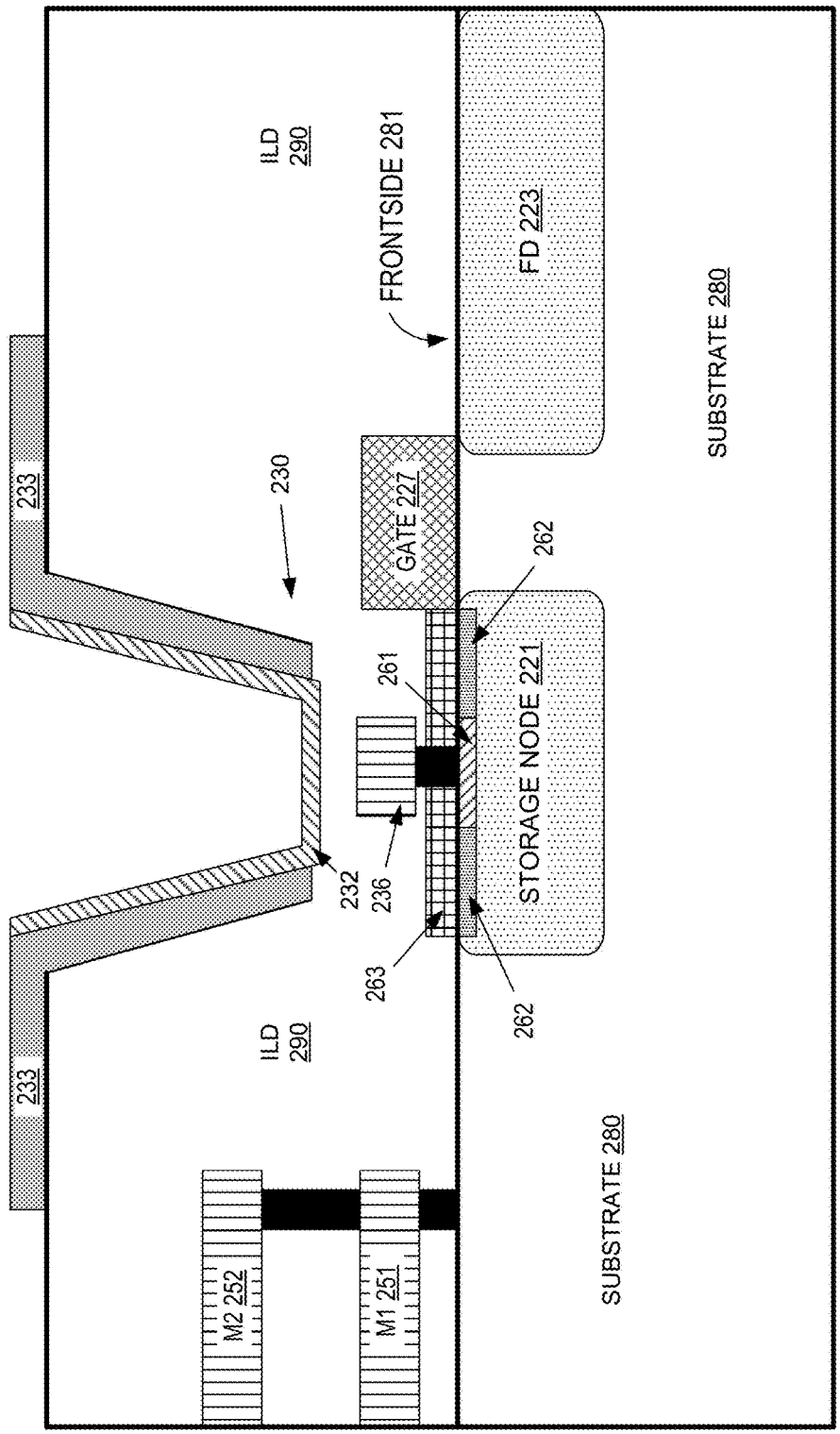

FIG. 3C shows another stage in the example fabrication process. In FIG. 3C, a conductive layer 233 is deposited in cavity 293, on sidewalls of cavity 293, and on interlayer dielectric 290. In some embodiments, a thin buffer dielectric layer (not shown) may be formed before conductive layer 233 so that conductive layer 233 is formed on the thin buffer dielectric layer. In FIG. 3D, a bottom portion of conductive layer 233 is removed from a floor of cavity 293. The bottom portion of conductive layer 233 may be removed by a patterned etch, for example. In FIG. 3E, a dielectric layer 232 is formed over conductive layer 233 within cavity 293.

Figure 3F:
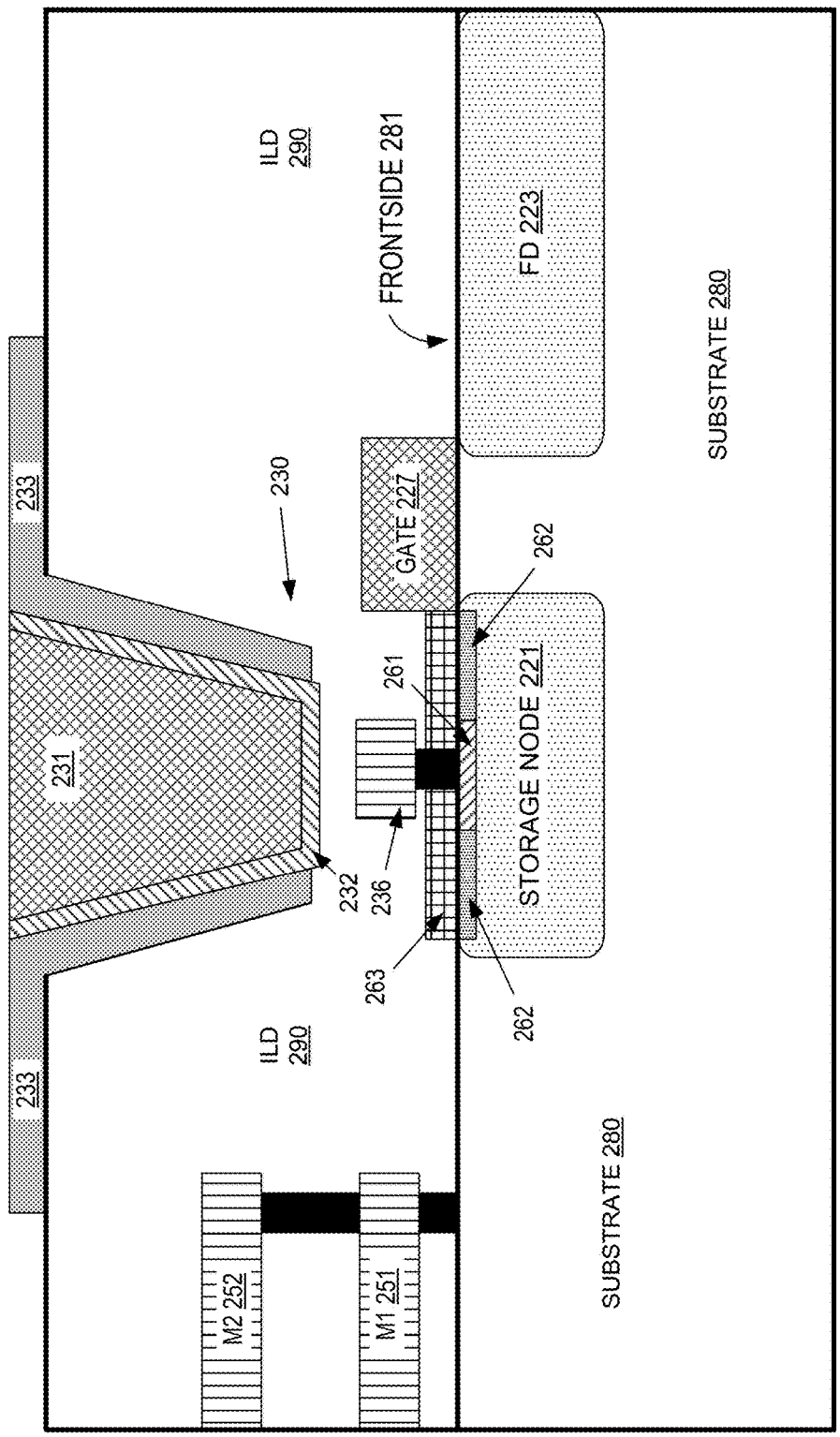

A photosensitive semiconductor material 231 is formed within the cavity and over dielectric layer 232, in FIG. 3F. Photosensitive semiconductor material 231 is low temperature polysilicon, in one embodiment. When the polysilicon is formed, a first portion of a deposition may include a higher doping concentration (P doped in one example) than a subsequent portion of the deposition. This results in low temperature polysilicon having a gradient having an increasing doping concentration along exterior portions of photosensitive semiconductor material 231 along the dielectric layer 232. Conductive layer 233 may be reflective to redirect received image light 205 into photosensitive semiconductor material 231.

Figure 3G:
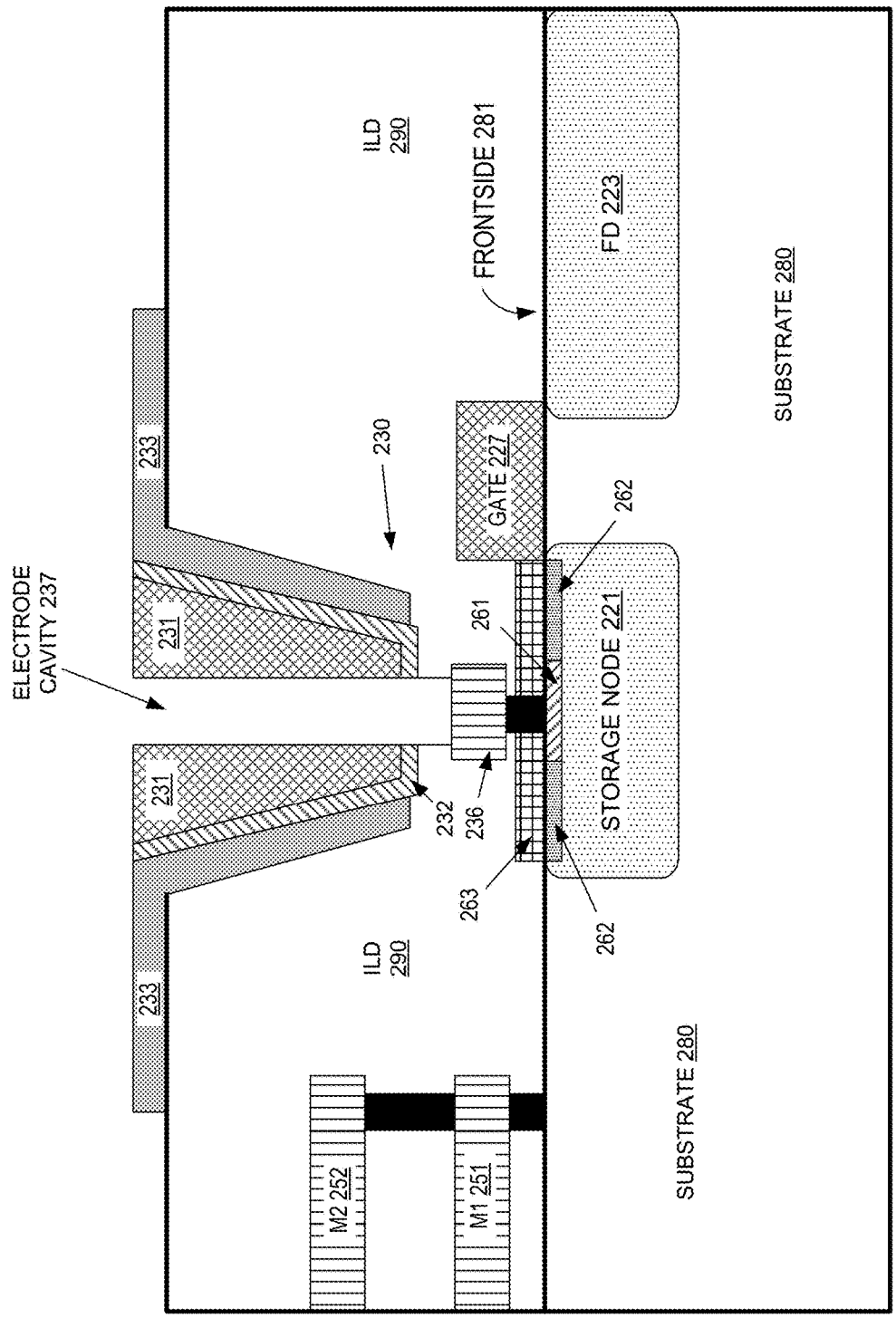

In FIG. 3G, an electrode cavity 237 is formed over contact element 236. In FIG. 3G, electrode cavity 237 extends to contact element 236 through interlayer dielectric 290, dielectric 232, and photosensitive semiconductor material 231.

Figure 3H:
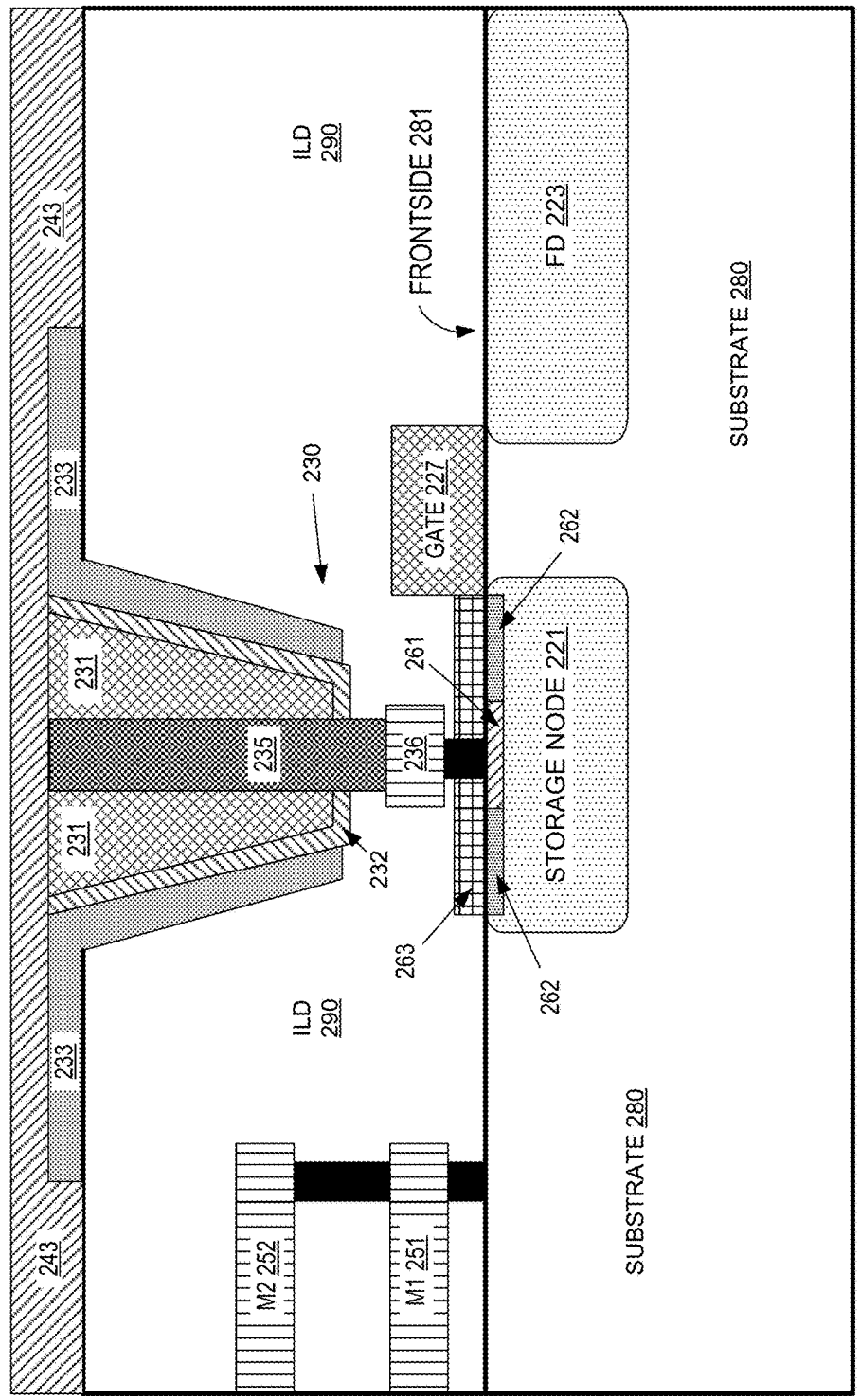

In FIG. 3H, electrode cavity 237 is filled with a conductive material to form electrode 235. In other embodiments, cavity 237 may be only partially filled to form electrode 235. Cavity 237 defines the shape of electrode 235, in the illustrated process. Cavity 237 and electrode 235 may be cylindrical. Electrode 235 may be metal or N+ polysilicon. After electrode 235 is formed in electrode cavity 237, a top dielectric layer 243 is formed over conductive layer 233, photosensitive semiconductor material 231, and dielectric layer 232.

Figure 3I:
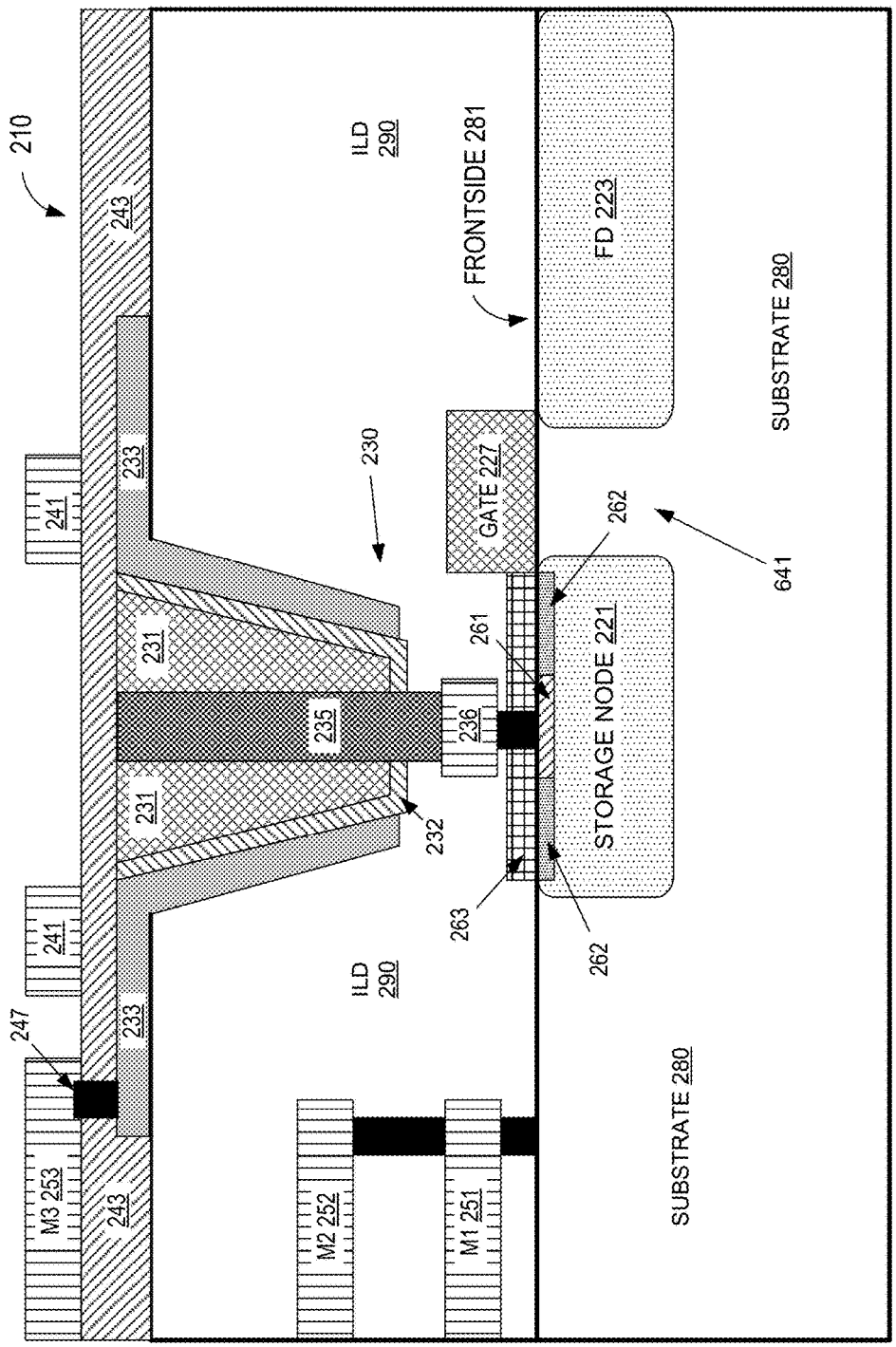

FIG. 3I shows a next stage in the fabrication process. In FIG. 3I, a bonding pad layer 253 and light blocking elements 241 are formed over top dielectric layer 243. Bonding pad layer 253 and light blocking elements 241 may be patterned from the same metal layer. A conductive via 247 may be formed through top dielectric layer 243 to provide an electrical signal (e.g. a bias voltage) to conductive layer 233.

Figure 5:
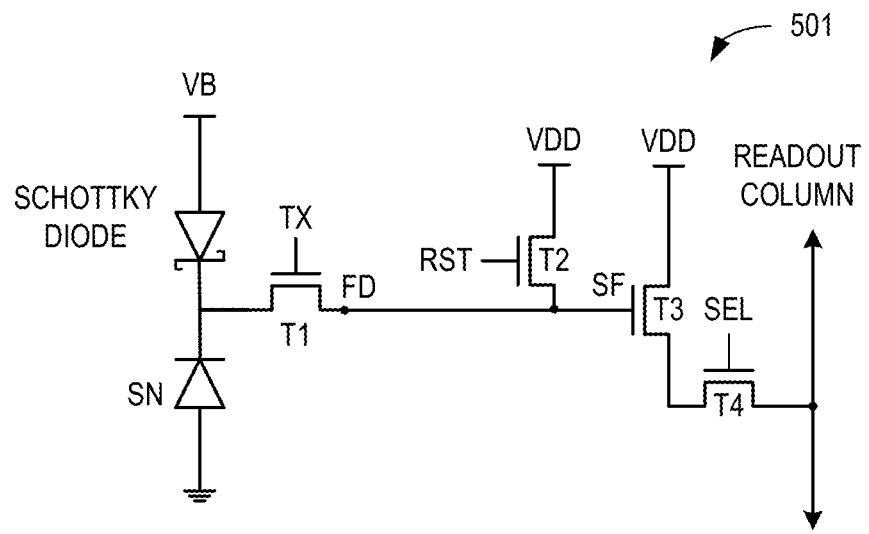
FIG. 5 shows a schematic modeling of a prior approach using low temperature polysilicon and a transparent electrode in a pixel.

FIG. 5 shows a schematic modeling of a prior approach using low temperature polysilicon and a transparent electrode in a pixel 501. In pixel 501, a storage node (SN) modeled as a diode is coupled to a transfer transistor TX to readout the photodiode. Polysilicon with a transparent conductive electrode form a Schottky diode that is also coupled to the transfer transistor. When image light encounters the polysilicon, the photoelectrons generated by the polysilicon influence the image charge within the storage node, which could then be transferred to a floating diffusion by the transfer transistor.

Figure 6:
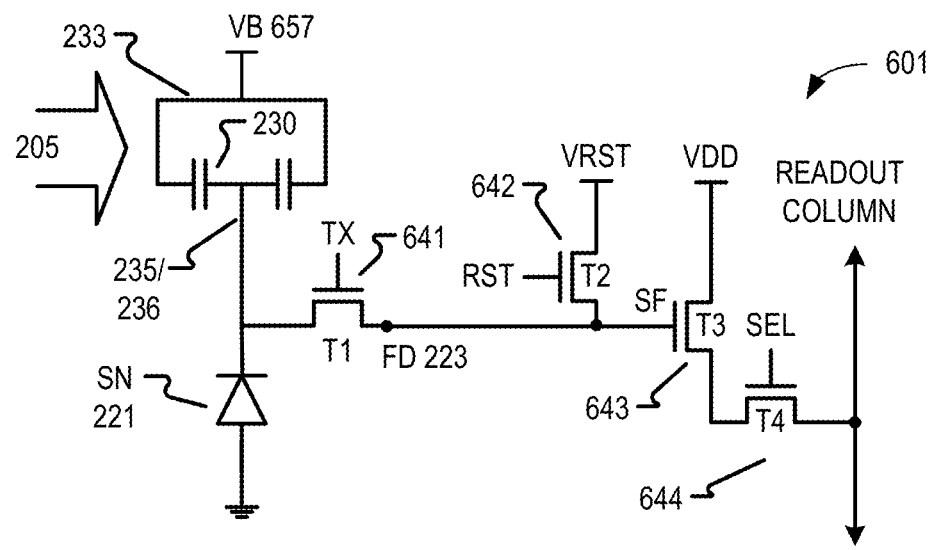
FIG. 6 illustrates a schematic modeling of a pixel that includes a photosensitive capacitor, in accordance with an embodiment of the disclosure.

In contrast to FIG. 5, FIG. 6 illustrates a schematic modeling of a pixel 601 that includes photosensitive capacitor 230, in accordance with an embodiment of the disclosure. Pixel 601 includes photosensitive capacitor 230 coupled to transfer transistor 641. Transfer transistor 641 includes charge storage node 221 and floating diffusion 223. The electrode 235/236 is coupled to charge storage node 221. Electrode 235/236 is one "plate" of photosensitive capacitor 230 and conductive layer 233 is the other "plate" of the photosensitive capacitor 230. When photosensitive capacitor 230 receives image light 205, an image signal in the form of photoelectrons are generated in the photosensitive semiconductor material 231. The image signal generated by photosensitive semiconductor material 231 will modify the potential on electrode 235/236 and corresponding charge storage node 221. Transfer transistor 641 is included in a transistor network that is coupled to readout the image charge from electrode 235/236. In FIG. 6, the transistor network includes transfer transistor (TX T1) 641, a reset transistor (RST T2) 642, a source follower transistor (SF T3) 643, and a row select transistor (SEL T4) 644. The transfer transistor network can readout the image signal by transferring the image charge to floating diffusion 223. Transistor 643 amplifies the image signal and when transistor 644 is activated, the amplified signal can be readout onto the readout column. Conductive layer 233 may be biased with a bias voltage 657. Reset transistor 642 can reset floating diffusion 223 when the reset transistor 642 is enabled. Bias voltage 657 on conductive layer 233 may be a negative voltage giving electrode 235/236 a higher potential so that photoelectrons will flow toward electrode 235 when they are generated by image light 205.

Reset transistor T2 642 is coupled between a reset voltage VRST and the floating diffusion FD 223 to reset pixel 601 (e.g., discharge or charge the FD to a preset voltage) under control of a reset signal RST. Reset voltage VRST is fixed to a pre-set voltage according to the specific implementation of pixel 601. The floating diffusion FD 223 is coupled to control the gate of SF transistor T3 643. SF transistor T3 is coupled between the power rail VDD and row select transistor T4 644. SF transistor T3 643 operates as a source-follower providing a high impedance connection to the floating diffusion FD 223. In one embodiment, the TX signal, the RST signal, and the SEL signal are generated by control circuitry 108.

Figure 4:
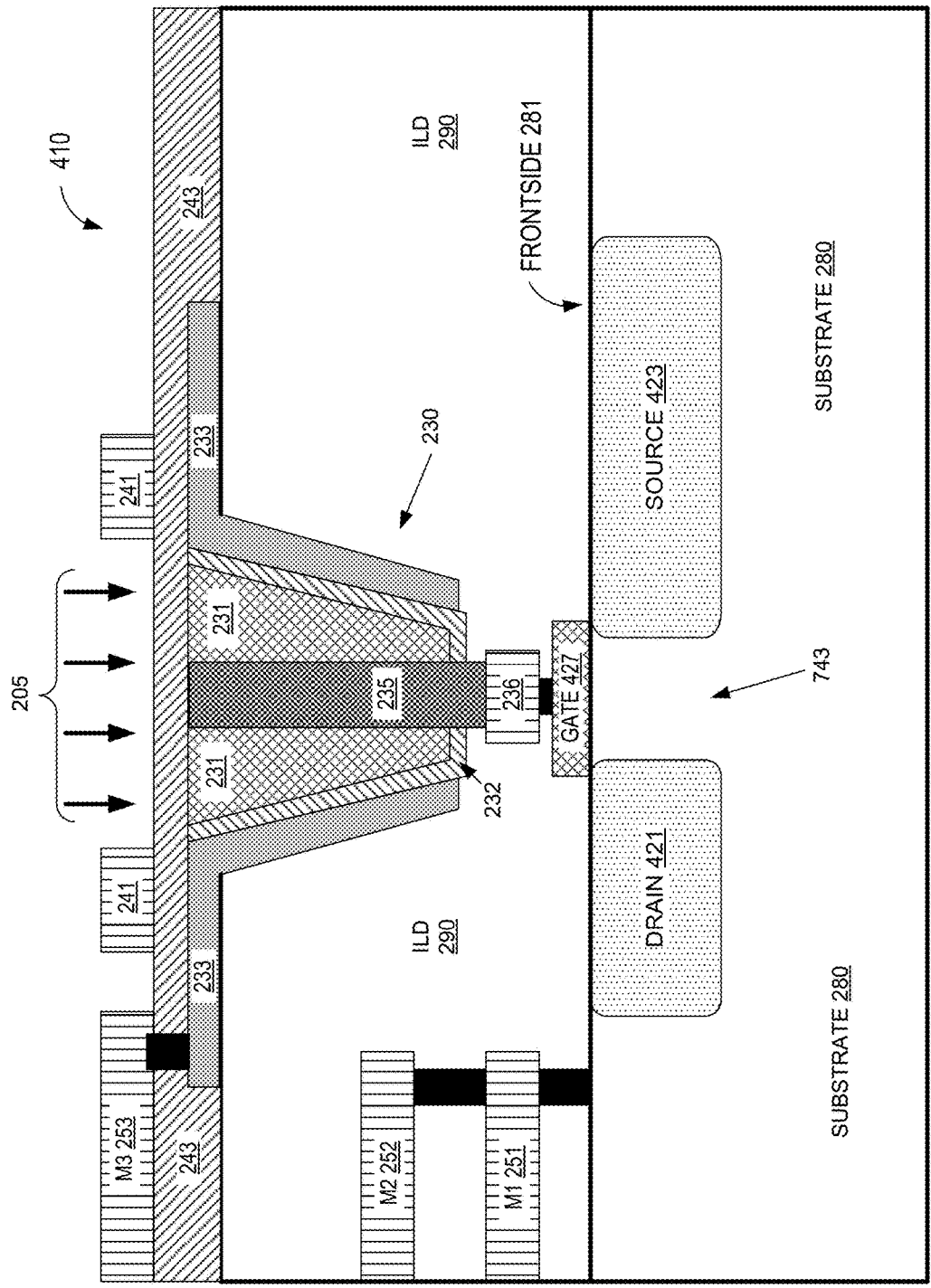
FIG. 4 illustrates one example of a photosensitive capacitor coupled to a gate of a transistor included in a pixel, in accordance with an embodiment of the disclosure.

FIG. 4 illustrates one example of a photosensitive capacitor 230 coupled to a gate 427 of a transistor included in a pixel 410, in accordance with an embodiment of the disclosure. Pixel 410 is one example of pixel 110. FIG. 4 is similar to the pixel illustrated in FIG. 3I except that electrode 235/236 is coupled to gate 427 of source follower transistor 743, which includes drain 421, source 423, and gate 427. When image light 205 generates an image signal in photosensitive semiconductor material 231, it modifies the potential on gate 427. The pixel illustrated in FIG. 4 can be fabricated similarly to the pixel illustrated in FIG. 3I. Pixel 410 differs from pixel 210 in that electrode 235 and contact 236 are coupled to a gate instead of a charge storage node.

FIG. 7A illustrates a schematic modeling of a pixel 701 that includes a photosensitive capacitor 230 coupled to gate 427 of transistor 743 of pixel 410, in accordance with an embodiment of the disclosure. When the potential on gate 427 is modified by the image signal, an amplified image signal is generated in source 423. The transistor network that reads out the image signal includes source follower transistor SF 743 and a row select transistor SEL 744 coupled to transfer the amplified image signal to the illustrated readout column. Reset transistor 742 is optionally included in the transistor network and is coupled to reset electrode 235/236 and gate 427 after an exposure period.

FIG. 7B shows a schematic modeling of photosensitive capacitor C1 230 and capacitor C2 748, which is the gate capacitance of transistor 743. Image light 205 generating electrons in photosensitive semiconductor material 231 functions as a current source between two capacitors in series. A small voltage change on C1 230 is reflected in a larger voltage across C2 748 if capacitor C2 is smaller than C1. The total capacitance for the capacitors in series is given by:

$$CT = \frac{C1 C2}{C1 + C2} \quad \text{(Equation 1)}$$

where CT is the total capacitance of C1 and C2 in series. The voltage across C1 230 is given by:

$$V1 = VB \frac{CT}{C1} \quad \text{(Equation 2)}$$

where V1 is the voltage across C1 230 and VB is bias voltage 757. The voltage across the gate of the transistor 743 is given by:

$$V2 = VB \frac{CT}{C2} \quad \text{(Equation 3)}$$

where V2 is the voltage across C2 748. Gate capacitance in source follower transistors is generally small and thus, the capacitance of C2 748 can be designed to split the bias voltage 757 between C2 748 and C1 230. If source follower 743 is N type, bias voltage 757 will be a positive voltage. Bias voltage 757 can be applied to conductive layer 233 by way of a via coupled to bonding pad 253.

FIG. 7C illustrates an example timing diagram for a method of operation of pixel 701, in accordance with an embodiment of the disclosure. At time zero, the bias voltage 757 is low (e.g. between zero and −1.0V), row select transistor SEL 744 is low (not enabled), and node 747 (the gate 427 of transistor 743) is low. At time t1, row select transistor SEL 744 is enabled which reads out a baseline signal 781 to the readout column. At time t2, row select transistor SEL 744 is disabled and conductive layer 233 is biased to a positive bias voltage (e.g. 3 volts) which is reflected onto node 747. Between time t2 and t3 (the integration period for pixel 701) the voltage on node 747 decreases as electrons are generated by image light 205 impacting photosensitive semiconductor material 231. High intensity image light 205 will increase the slope of the voltage on node 747 between time t2 and t3, whereas a low intensity image light 205 will have decrease the slope of the voltage on node 747 between time t2 and t3. At t3, row select transistor SEL 744 is enabled which reads out image signal 782 to the readout column. At time t4, bias voltage 757 is driven low and row select transistor SEL 744 is disabled. Baseline signal 781 can be subtracted from image signal 782 to generate a noise-corrected signal. If reset transistor 742 is included in the transistor network in pixel 701, it would be pulsed after time t4 to reset node 747.

Image sensors that use the disclosed pixels that include photosensitive capacitors may be more compatible with standard logic and Dynamic Random-Access Memory ("DRAM") fabrication than conventional approaches. In particular, the disclosed pixels do not require the deep implants and special isolation processes used for conventional CMOS image sensors. Additionally, since the photosensitive element (photosensitive capacitor 230) is formed at the end of the fabrication, it avoids wafer handling and thinning currently used in forming pixels in conventional Backside-illuminated CMOS image sensors. Furthermore, the embodiment in FIG. 4 and modeled in FIG. 7A can be implemented with two pixels where conventional approaches have needed three or four pixels in a transistor network to readout each pixel. Reducing the transistor count may increase the area for photosensitive material in the pixels—thereby increasing image sensor performance.

The methods of operating pixels and image sensors explained above may be implemented with computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible non-transitory machine-readable storage medium includes any mechanism that provides (i.e., stores) information in a form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method of fabricating a pixel array for an image sensor, the method comprising:
    forming a transistor network in a semiconductor substrate layer along a frontside of the semiconductor substrate;
    forming a contact element for every pixel in the pixel array, wherein each contact element is electrically coupled to a transistor within the transistor network;
    forming an interconnect layer upon the frontside of the semiconductor substrate layer, wherein the interconnect layer is for facilitating control of the transistor network, and wherein the interconnect layer includes a dielectric that covers the contact element;
    forming a cavity in the interconnect layer, wherein the cavity is formed over the contact element;
    forming a conductive layer along cavity walls of the cavity;

forming a dielectric layer over the conductive layer within the cavity;

depositing a photosensitive semiconductor material within the cavity and over the dielectric layer;

forming an electrode cavity over the contact element, wherein the electrode cavity extends to the contact element;

filling, at least partially, the electrode cavity with a conductive material to form an electrode, wherein the electrode, the conductive layer, and the photosensitive semiconductor material form a photosensitive capacitor configured to vary an image signal received by the contact element in response to image light.

2. The method of claim 1, wherein the conductive layer is reflective to the image light.

3. The method of claim 1, wherein the contact element is coupled to a charge storage node of a transfer transistor, wherein the transfer transistor is coupled to transfer image charge generated by the photosensitive capacitor to a floating diffusion within the semiconductor substrate layer when the transfer transistor is activated.

4. The method of claim 1, wherein the contact element is coupled to a control terminal of a source follower transistor that generates an amplified image signal in response to an image charge generated by the photosensitive capacitor.

5. The method of claim 1 further comprising:
forming a buffer dielectric layer on the cavity walls before depositing the conductive layer on the cavity walls.

6. The method of claim 1 further comprising:
removing a bottom portion of the conductive layer disposed on a floor of the cavity prior to forming the dielectric layer.

7. The method of claim 1, wherein the photosensitive semiconductor material includes amorphous silicon.

8. The method of claim 1, wherein said depositing the photosensitive semiconductor material within the cavity includes doping the photosensitive semiconductor material more at a start of the deposition than an end of the deposition.

9. The method of claim 1 further comprising:
forming a top dielectric layer over the conductive layer, the photosensitive semiconductor material, and the dielectric layer; and
forming a conductive via to the conductive layer through the top dielectric layer for providing an electrical signal to the conductive layer.

10. The method of claim 1, wherein said forming the contact element includes forming a metal contact layer within the dielectric layer.

* * * * *